(12) United States Patent
Goh et al.

(10) Patent No.: US 7,772,764 B2
(45) Date of Patent: Aug. 10, 2010

(54) DISPLAY DEVICE AND METHOD OF MANUFACTURING THE SAME

(75) Inventors: Joon-Chul Goh, Seoul (KR); Beohm-Rock Choi, Seoul (KR); Jung-Soo Rhee, Seoul (KR); Joon-Hoo Choi, Seoul (KR); Kwang-Chul Jung, Seongnam-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 194 days.

(21) Appl. No.: 11/553,869

(22) Filed: Oct. 27, 2006

(65) Prior Publication Data
US 2007/0120457 A1 May 31, 2007

(30) Foreign Application Priority Data
Oct. 28, 2005 (KR) .................. 10-2005-0102590

(51) Int. Cl.
*H01J 1/62* (2006.01)
(52) U.S. Cl. ................. 313/505; 349/139; 361/212
(58) Field of Classification Search ......... 313/498–512; 257/59, 355–356, 40, 72, 98–100, 642–643, 257/759; 345/76; 361/54, 111; 349/33, 349/40; 327/310, 318; 326/82, 86; 315/169.1, 315/169.3; 428/690–691, 917; 438/26–29, 438/34, 82; 427/58, 64, 66, 532–535, 539; 445/24–25
See application file for complete search history.

(56) References Cited

U.S. PATENT DOCUMENTS

| | | | | |
|---|---|---|---|---|
| 5,166,089 A | * | 11/1992 | Chen et al. ............... | 438/328 |
| 6,043,971 A | * | 3/2000 | Song et al. ............... | 361/111 |
| 6,310,666 B1 | * | 10/2001 | Moon ...................... | 349/40 |
| 6,380,559 B1 | * | 4/2002 | Park et al. ............... | 257/59 |
| 6,429,057 B1 | * | 8/2002 | Hong et al. .............. | 438/158 |
| 6,531,392 B2 | * | 3/2003 | Song et al. .............. | 438/648 |
| 6,788,278 B2 | * | 9/2004 | Aoki ...................... | 345/82 |
| 6,798,132 B2 | * | 9/2004 | Satake .................... | 313/495 |
| 6,833,900 B2 | * | 12/2004 | Aruga ..................... | 349/149 |
| 2002/0003403 A1 | * | 1/2002 | Ghosh et al. ............ | 313/512 |
| 2002/0130324 A1 | * | 9/2002 | Song et al. .............. | 257/72 |
| 2006/0197086 A1 | * | 9/2006 | Rhee et al. .............. | 257/59 |

FOREIGN PATENT DOCUMENTS

JP 2004-335123 11/2004

(Continued)

*Primary Examiner*—Peter J Macchiarolo
*Assistant Examiner*—Donald L Raleigh
(74) *Attorney, Agent, or Firm*—H.C. Park & Associates, PLC

(57) ABSTRACT

A display device and a method of manufacturing the display device are provided. The display device includes a substrate; a driving voltage line disposed on the substrate; a driving voltage line pad to transmit a driving voltage to the driving voltage line; a driving transistor connected to the driving voltage line; a pixel electrode connected to the driving transistor; a common electrode opposing the pixel electrode; a light emitting member disposed between the pixel electrode and the common electrode; and a common electrode pad disposed on the substrate so as to transmit a common voltage to the common electrode. The common electrode pad and the driving voltage line pad are exposed at a side surface of the substrate.

23 Claims, 14 Drawing Sheets

FOREIGN PATENT DOCUMENTS

| | | |
|---|---|---|
| JP | 2004-355993 | 12/2004 |
| JP | 2005-100904 | 4/2005 |
| JP | 2005-158698 | 6/2005 |
| KR | 2003-0022470 | 3/2003 |
| KR | 2003-0022471 | 3/2003 |
| KR | 10-2003-0083455 | 10/2003 |
| KR | 10-2005-0011900 | 1/2005 |
| KR | 10-2005-0050485 | 5/2005 |
| KR | 10-2005-0065833 | 6/2005 |

* cited by examiner

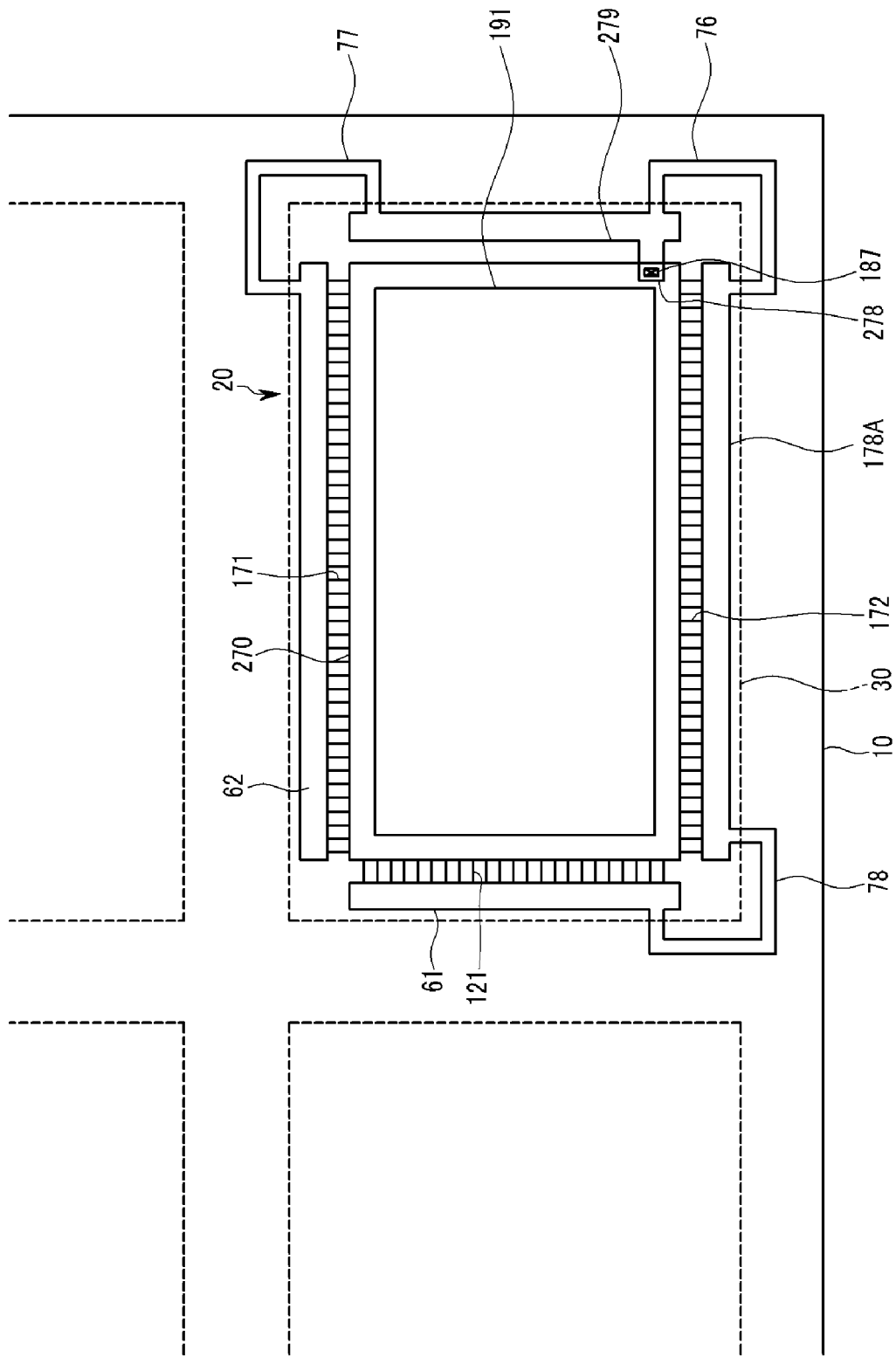

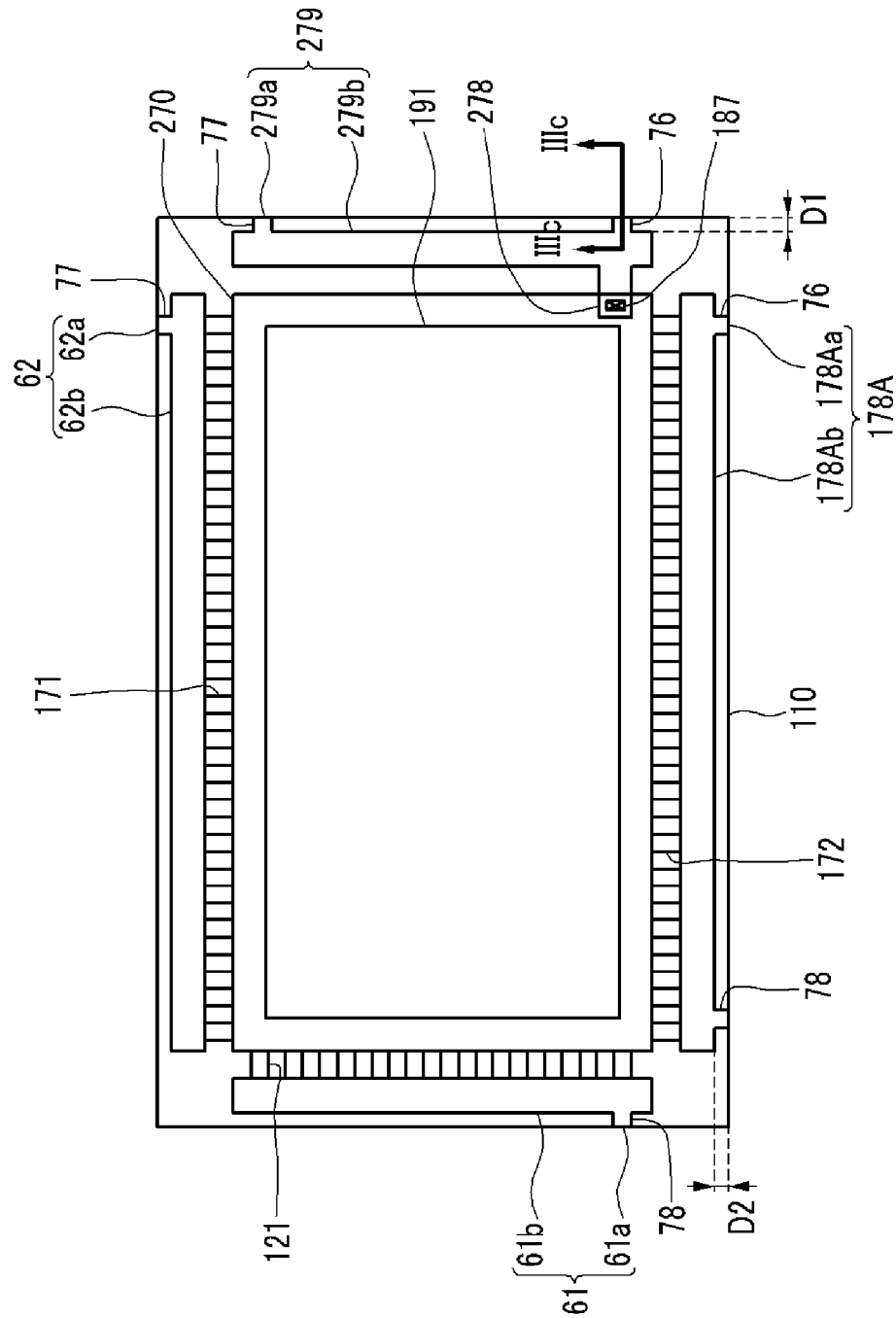

DISPLAY DEVICE AND METHOD OF MANUFACTURING THE SAME

CROSS-REFERENCE TO RELATED APPLICATION

This application claims priority to and the benefit of Korean Patent Application No. 10-2005-0102590, filed on Oct. 28, 2005, which is hereby incorporated by reference for all purposes as if fully set forth herein.

BACKGROUND OF THE INVENTION

1. Field of the Invention

The present invention relates to a display device and a method of manufacturing the display device.

2. Discussion of the Background

Recently, lighter and thinner monitors and television sets have been required. With this requirement, cathode ray tubes (CRTs) have been replaced with flat panel display devices such as liquid crystal displays (LCDs).

However, since an LCD may require a backlight unit to display an image, it may have a slow response speed and narrow viewing angle.

Since an organic light emitting display (OLED) does not have such problems, it is attracting increasing attention.

Generally, an OLED display includes a light emitting layer interposed between two electrodes. Electrons injected from one electrode and holes injected from the other electrode combine to form excitons, which emit energy and light.

Since the OLED display does not require an additional light source such as the backlight unit, the OLED display may have advantages of low power consumption, fast response speed, wide viewing angle, and high contrast ratio.

An OLED display may be a passive matrix or active matrix display depending upon its driving method.

The passive matrix display has a simple structure in which light emits from a region where two electrodes cross each other. On the other hand, the active matrix display has a structure in which light emits by current-driven pixels using thin film transistors (TFTs).

The active matrix OLED display may be a bottom emission type and/or a top emission type depending upon its light emission method. The bottom emission type display emits light toward a substrate where the TFTs are formed, and the top emission type display emits light away from the substrate where the TFTs are formed.

The bottom emission type display may have a low aperture ratio since light cannot pass through a portion where its TFTs and wires are formed. On the other hand, the top emission type display may have a high aperture ratio since the light emitting region is not associated with the space occupied by the TFTs and wires.

The above information disclosed in this background section is only for enhancement of understanding of the background of the present invention and therefore it may contain information that does not form the prior art that is already known in this country to a person of ordinary skill in the art.

SUMMARY OF THE INVENTION

The present invention provides a display and a method of manufacturing the display that may prevent accumulation of charges on the common electrode during the manufacturing processes.

Additional features of the invention will be set forth in the description which follows, and in part will be apparent from the description, or may be learned by practice of the invention.

The present invention discloses a display device including a substrate, a driving voltage line disposed on the substrate, and a driving voltage line pad to receive and transmit a driving voltage to the driving voltage line. A driving transistor is connected to the driving voltage line, a pixel electrode is connected to the driving transistor, and a common electrode opposes the pixel electrode. A light emitting member is disposed between the pixel electrode and the common electrode, and a common electrode pad is formed on the substrate so as to transmit a common voltage to the common electrode. Portions of the common electrode pad and the driving voltage line pad are exposed at a side surface of the substrate.

The present invention also discloses a method of manufacturing a display device including forming a plurality of gate lines, a driving voltage line including a driving voltage line pad, a plurality of data lines, and a common electrode pad on a substrate. A first connecting member is formed between the driving voltage line pad and the common electrode pad, and a protective film and a pixel electrode are formed on the gate lines, the driving voltage line, and the data lines. A light emitting layer is formed on the pixel electrode, a common electrode is formed on the light emitting layer, a sealing member is formed on the common electrode, and the substrate is cut.

The present invention also discloses a method of manufacturing a display device including forming a plurality of gate lines, a driving voltage line including a driving voltage line pad, a plurality of data lines, and a common electrode pad on a substrate. A discharge member is formed connected to the common electrode pad, and a protective film and a pixel electrode are formed on the gate lines, the driving voltage line, and the data lines. A light emitting layer is formed on the pixel electrode, and a common electrode is formed on the light emitting layer. A sealing member is formed on the common electrode, and the substrate is cut.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIG. 3A is a view showing a layout of a display device on a base substrate according to an exemplary embodiment of the present invention.

FIG. 3B is a view showing a layout of the display device of FIG. 3A.

DETAILED DESCRIPTION OF THE ILLUSTRATED EMBODIMENTS

Figure 1:
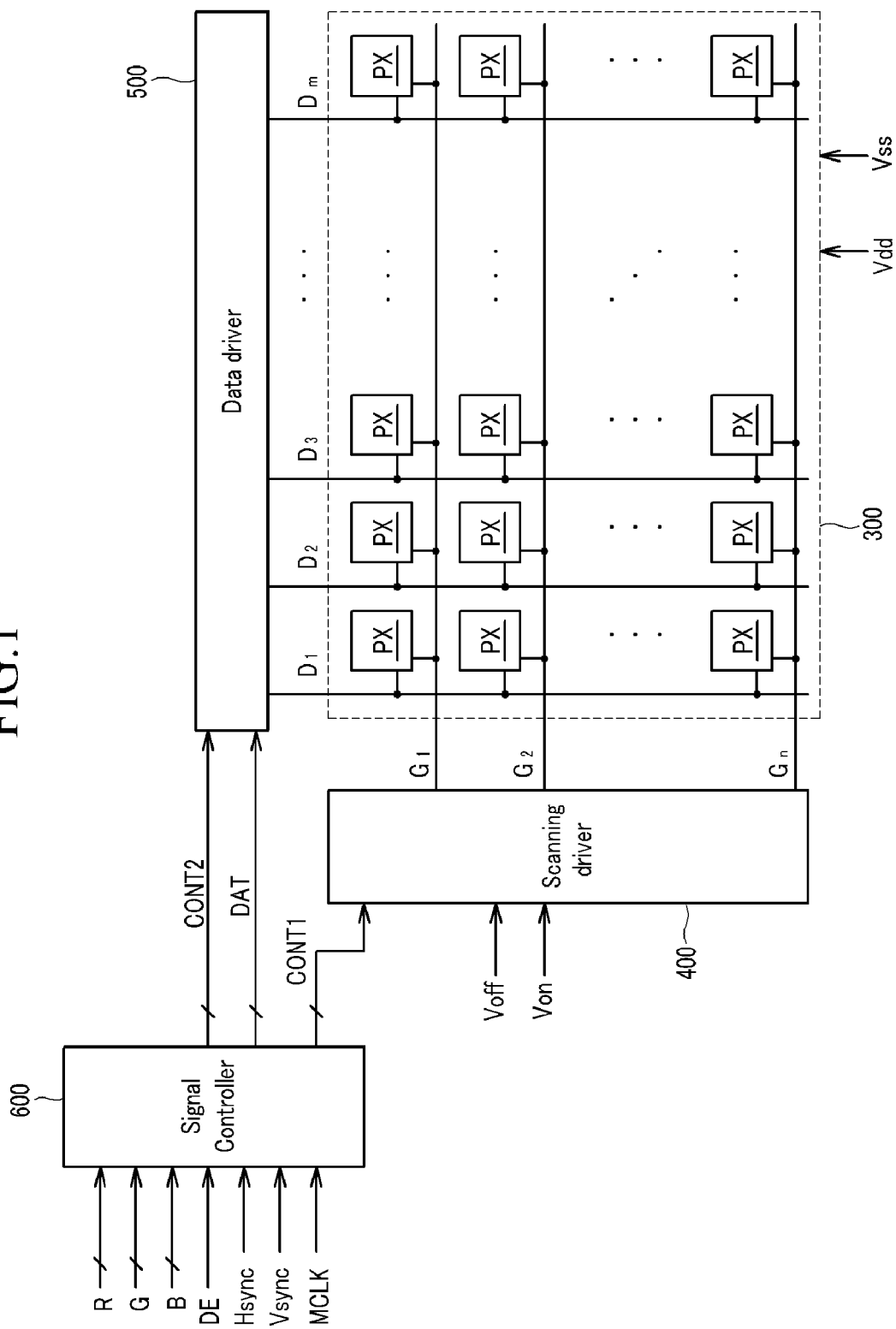
FIG. 1 is a block diagram showing a display device according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

In the exemplary embodiments of the present invention, the OLED display includes a pixel electrode and a common electrode opposing each other and a light emitting member interposed therebetween.

According to conventional manufacturing processes, when forming the common electrode or performing an encapsulating process on the common electrode, charges may accumulate on the common electrode due to electron injection, ion injection, or electrostatics.

When charges accumulate on the common electrode, the light emitting member may not operate since a potential difference is generated between the common electrode and the light emitting member.

Consequently, surfaces of the light emitting member, the pixel electrode, or the common electrode may peel off, thereby deteriorating the display device's quality.

In order to solve this problem, the present invention provides a display device and a method of manufacturing the display device in which it may be possible to prevent charge accumulation on the common electrode during the manufacturing processes.

Figure 2:
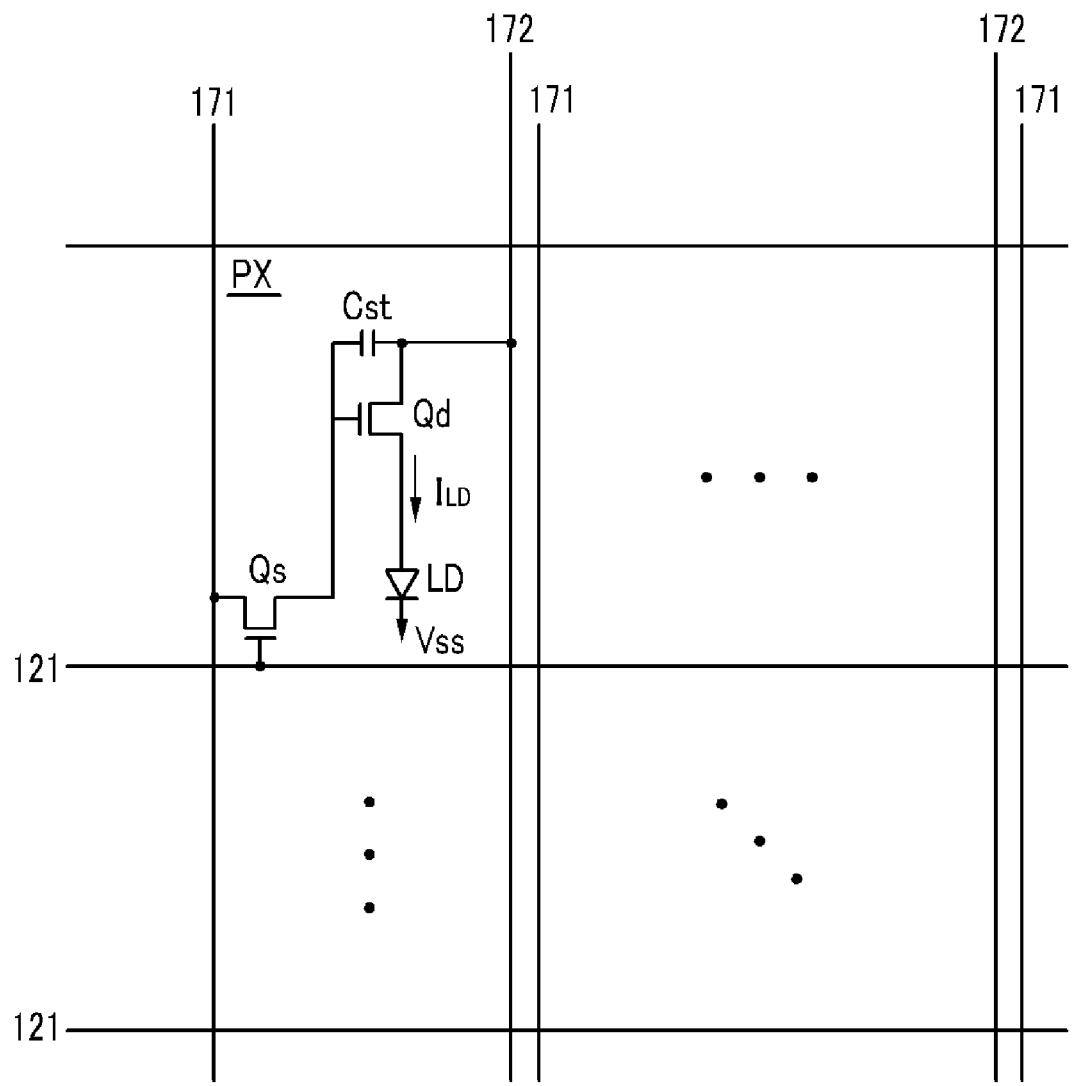
FIG. 2 is an equivalent circuit diagram showing a display device according to an exemplary embodiment of the present invention.

FIG. 1 is a block diagram showing an OLED display according to an exemplary embodiment of the present invention, and FIG. 2 is an equivalent circuit diagram showing a pixel of the OLED display of FIG. 1.

Referring to FIG. 1, the OLED display includes a display panel 300, a scanning driver 400 and data driver 500 connected to the display panel 300, and a signal controller 600 that controls the drivers.

The display panel 300 includes a plurality of display signal lines $G_1$ to $G_n$ and $D_1$ to $D_m$, a plurality of driving voltage lines (not shown), and a plurality of pixels PX that are connected to the lines and arrayed substantially in a matrix.

The display signal lines $G_1$ to $G_n$ and $D_1$ to $D_m$ include a plurality of gate lines $G_1$ to $G_n$ that transmit scan signals and a plurality of data lines $D_1$ to $D_m$ that transmit data voltages.

The gate lines $G_1$ to $G_n$ extend substantially in the row direction and are separated from each other while being substantially parallel to each other.

The data lines $D_1$ to $D_m$ extend substantially in the column direction and are separated from each other while being substantially parallel to each other.

The driving voltage lines transmit driving voltages Vdd to the pixels PX.

As shown in FIG. 2, each pixel PX is connected to a gate line 121 and data line 171, and includes an organic light emitting diode LD, a driving transistor Qd, a capacitor Cst, and a switching transistor Qs.

The driving transistor Qd is a three-port device having a control port connected to the switching transistor Qd and the capacitor Cst, an input port connected to a driving voltage line 172 (i.e. Vdd), and an output port connected to the organic light emitting diode LD.

The switching transistor Qs is also a three-port device having a control port connected to the gate line 121, an input port connected to the data line 171, and an output port connected to the capacitor Cst and the driving transistor Qd.

The capacitor Cst is connected between the switching transistor Qs and the driving voltage line 172. The capacitor Cst sustains the data voltage charged by the switching transistor Qs for a predetermined time period.

The anode and cathode of the organic light emitting diode LD are connected to the driving transistor Qd and a common voltage Vss, respectively.

The organic light emitting diode LD emits light with different intensities according to an amount of a current $I_{LD}$ supplied by the driving transistor Qd to display an image.

The amount of the current $I_{LD}$ depends on a magnitude of a voltage Vgs between the control port and the input port of the driving transistor Qd.

The switching and driving transistors Qs and Qd are an n-channel field effect transistors (FETs) made of an amorphous silicon or polysilicon.

Alternatively, these transistors Qs and Qd may be p-channel field effect transistors. In this case, the operation, voltage, and current of the p-channel field effect transistors would be opposite to those of the n-channel field effect transistors.

The display device of FIG. 1 will be described in detail below with reference to FIG. 3A, FIG. 3B, and FIG. 3C.

Figure 3C:
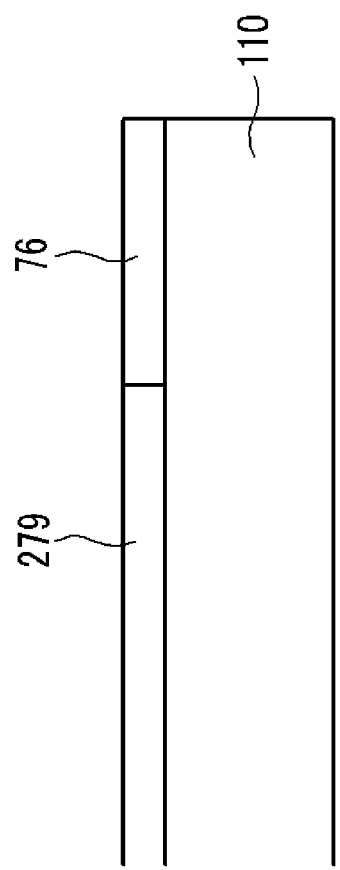
FIG. 3C is a cross-sectional view taken along line III-III of FIG. 3B.

FIG. 3A is a view showing a layout of the display device formed on a base substrate according to an exemplary embodiment of the present invention, FIG. 3B is a view showing a layout of the display device after being cut out from the base substrate of FIG. 3A, and FIG. 3C is a cross-sectional view taken along line IIIc-IIIc of FIG. 3B.

Referring to FIG. 3A, a base substrate 10, which may be made of a transparent glass or plastic material, includes a plurality of unit areas 20. Each unit area 20 is defined by a cutting-plane line 30.

A plurality of gate lines 121, a plurality of data lines 171, a plurality of driving voltage lines 172, and thin film transistors (not shown), which are connected to the lines 121, 171, and 172, are formed in the unit area 20.

A pixel electrode 191 is formed on the gate lines 121, the data lines 171, the driving voltage lines 172, and the thin film transistor.

A light emitting member (not shown) is formed between the pixel electrode 191 and a common electrode 270.

A gate line shorting bar 61, which connects the gate lines 121 to each other, is formed along one periphery of the pixel electrode 191 and the common electrode 270, and a data line shorting bar 62, which connects the data lines 171 to each other, is formed along another periphery of the pixel electrode 191 and the common electrode 270.

A common electrode pad 279 is formed along another periphery of the pixel electrode 191 and the common electrode 270.

A portion of the common electrode pad 279 extends to serve as a contact 278 for connecting the common electrode 270 thereto via contact hole 187.

The common electrode pad 279 receives a common voltage Vcom and transmits the common voltage Vcom to the common electrode 270 through the contact 278.

The common electrode pad 279 may be made of the same material as the gate lines 121 or the data lines 171.

A driving voltage line pad 178A, which transmits a driving voltage to the driving voltage lines 172, is formed along another periphery of the pixel electrode 191 and the common electrode 270.

The driving voltage line pad 178A receives a driving voltage Vdd and transmits the driving voltage Vdd to the respective driving voltage lines 172.

The driving voltage line pad 178A may be made of the same material as the data lines 171.

A connector 76 electrically connects the common electrode pad 279 and the driving voltage line pad 178A to each other.

When the common electrode pad 279 is made of the same material as the gate lines 121, the connector 76 may be made of a transparent conductive material such as indium tin oxide (ITO) or indium zinc oxide (IZO). When the common electrode pad 279 is made of the same material as the data lines 171, the connector 76 may also be made of the same material as the data lines 171.

A connector 77 electrically connects the common electrode pad 279 and the data line shorting bar 62 to each other. A connector 78 electrically connects the driving voltage line pad 178A and the gate line shorting bar 61 to each other.

In addition to the gate line shorting bar 61 and the data line shorting bar 62, the common electrode pad 279 or the driving voltage line pad 178A may also be connected to another portion that connects the gate lines 121 or the data lines 171 to each other.

The positions of the common electrode pad 279 and the driving voltage line pad 178A may be changed with each other. Hence, the connectional relationship with the shorting bars 61 and 62 may accordingly vary.

By electrically connecting the common electrode pad 279 to the gate line shorting bar 61, the data line shorting bar 62 and the driving voltage line pad 178A, it is possible to move charges generated in the common electrode 270 to another connection channel.

With such an arrangement, it may be possible to minimize failure caused by the charges in the common electrode 270.

Hereinafter, a method of manufacturing the display device according to an exemplary embodiment of the present invention will be described in detail below with reference to FIG. 3A, FIG. 3B, and FIG. 3C.

As shown in FIG. 3A, metal films may be sequentially stacked on the base substrate 10 for each unit area 20 by performing a sputtering process or the like. The metal films are then subject to a photolithography process to form a gate conductor including the gate lines 121, the gate line shorting bar 61, and the common electrode pad 279.

Next, a gate insulating layer (not shown) and a plurality of semiconductors (not shown) are formed.

Thereafter, metal films are stacked by performing a sputtering process or the like, and are subject to a photolithography process to form a data conductor including the data lines 171, the driving voltage lines 172, and the driving voltage line pad 178A.

An inorganic insulating material or a photosensitive insulating material is then coated by a chemical vapor deposition process or the like to form a protective film (not shown).

The pixel electrode 191 is formed on the protective film, and the connectors 76, 77, and 78 that connect the gate line shorting bar 61, the data line shorting bar 62, the common electrode pad 279, and the driving voltage line pad 178A are concurrently formed.

The connectors 76, 77, and 78 extend beyond the cutting-plane line 30 that defines each unit area 20.

A light emitting member (not shown) is formed on the pixel electrode 191.

The common electrode 270 is formed on the light emitting member.

A sealing member (not shown) is provided on the common electrode 270, and it seals the unit areas 20.

After the sealing process, the unit areas 20 are cut along the cutting-plane line 30 to form a single display device.

At this time, the connectors 76, 77, and 78 are cut at the cutting-plane line 30.

More specifically, portions of the connectors 76, 77, and 78 inside the cutting-plane line 30 constitute portions of the gate line shorting bar 61, the data line shorting bar 62, the common electrode pad 279 or the driving voltage line pad 178A, and portions of the connectors 76, 77, and 78 outside the cutting-plane line 30 are removed.

As a result, the gate line shorting bar 61, the data line shorting bar 62, the common electrode pad 279 and the driving voltage line pad 178A are divided into first portions 61a, 62a, 279a, and 178Aa, which are exposed at a side of a substrate 110, and second portions 61b, 62b, 279b, and 178Ab, which are not exposed at a side of the substrate 110.

The distance D1 between the second portion 279b of the common electrode pad 279 and the substrate 110 and the distance D2 between the driving voltage line pad 178A and the substrate 110 may be 25 μm or less.

When the common electrode pad 279 is made of the same material as the data conductor, the common electrode pad 279 and the data conductor may be formed simultaneously.

Additionally, the connectors 76, 77, and 78 may be made of the same material as the common electrode 270 and formed at the time of forming the common electrode 270 rather than the pixel electrode 191.

Hereinafter, a display device according to another exemplary embodiment of the present invention will be described below in detail with reference to FIG. 4.

Figure 4:
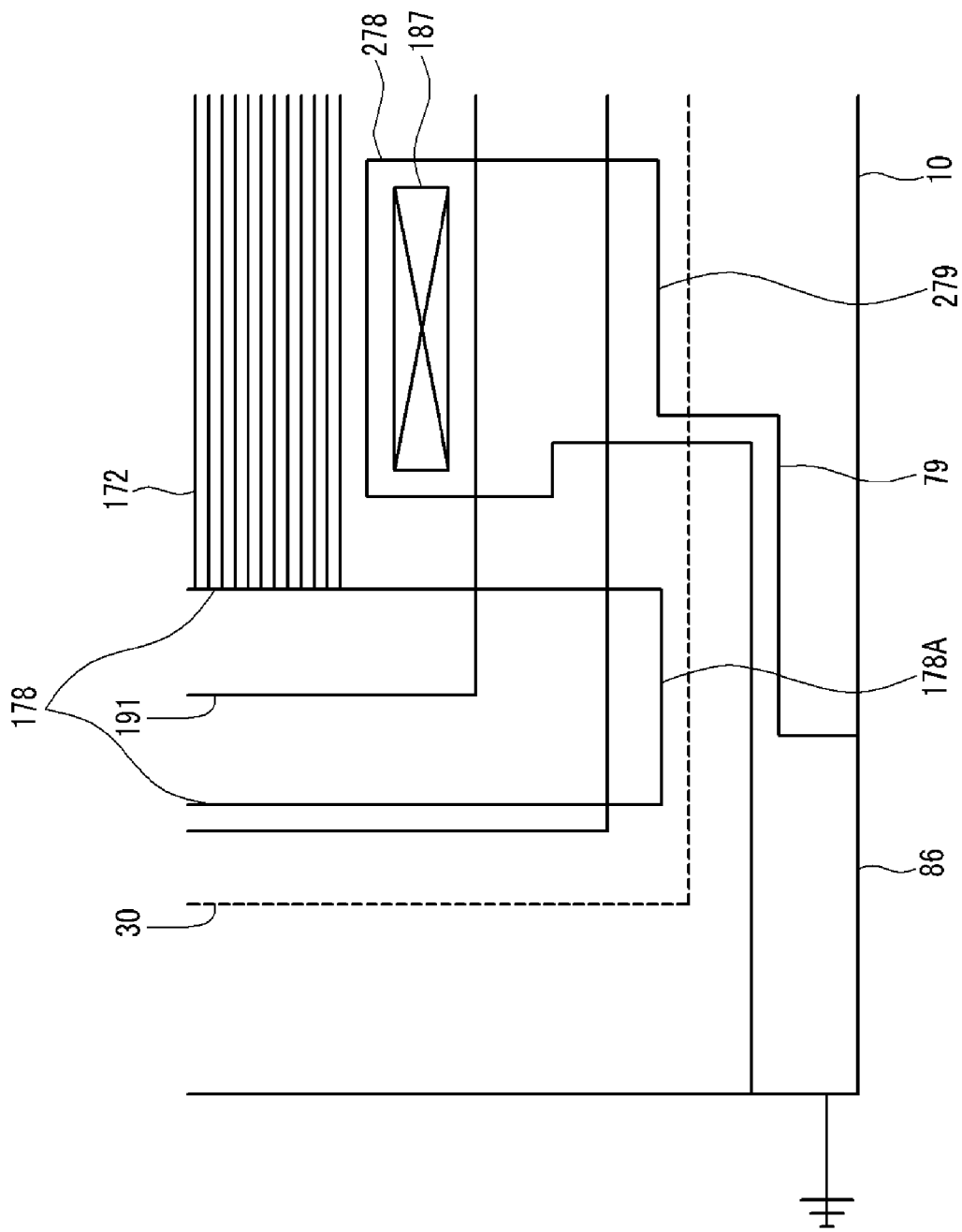
FIG. 4 is a view showing a portion of a layout of a display device according to another exemplary embodiment of the present invention.

FIG. 4 is a view showing a portion of a layout of a display device according to another exemplary embodiment of the present invention, in which the display device is formed on a base substrate.

Similar to the previous embodiment, the display device according to the present embodiment includes gate lines (not shown), data lines (not shown), driving voltage lines 172, and a thin film transistor (not shown) connected to the lines, formed on the base substrate 10.

A pixel electrode 191 is formed on the gate lines, the data lines, the driving voltage lines 172, and the thin film transistor.

A light emitting member (not shown) is formed between the pixel electrode 191 and a common electrode (not shown).

A common electrode pad 279 is formed along one periphery of the pixel electrode 191.

A portion of the common electrode pad 279 extends to serve as a contact 278 for connecting with the common electrode 270.

A driving voltage supply line 178 is commonly connected to the driving voltage lines 172, and the driving voltage supply line 178 extends to a portion neighboring the common electrode pad 279 to form the driving voltage line pad 178A.

In other words, unlike the display device in FIG. 3A, according to the present exemplary embodiment, the common electrode pad 279 and the driving voltage line pad 178A are arranged along the same periphery of the pixel electrode 191.

Additionally, the display device according to the present exemplary embodiment includes a discharge member 86 formed on the base substrate 10.

The discharge member 86 is electrically connected to the common electrode pad 279 through the connector 79.

The discharge member 86 is connected to a ground potential, and may be made of the same material as the gate lines, the data lines, the pixel electrodes 191, or the common electrode 270.

Since the discharge member 86 is formed outside the cutting-plane line 30 like the connectors 76, 77, and 78 of FIG. 3A, the discharge member 86 is removed in the cutting process.

With such an arrangement, it is possible to discharge the charges generated in the common electrode 270 to an outer space through the discharge member 86.

Accordingly, it may be possible to minimize failures caused by the charges generated in the common electrode 270 during the manufacturing processes.

Next, a display device according to another exemplary embodiment of the present invention will be described in detail below with reference to FIG. 5.

Figure 5:
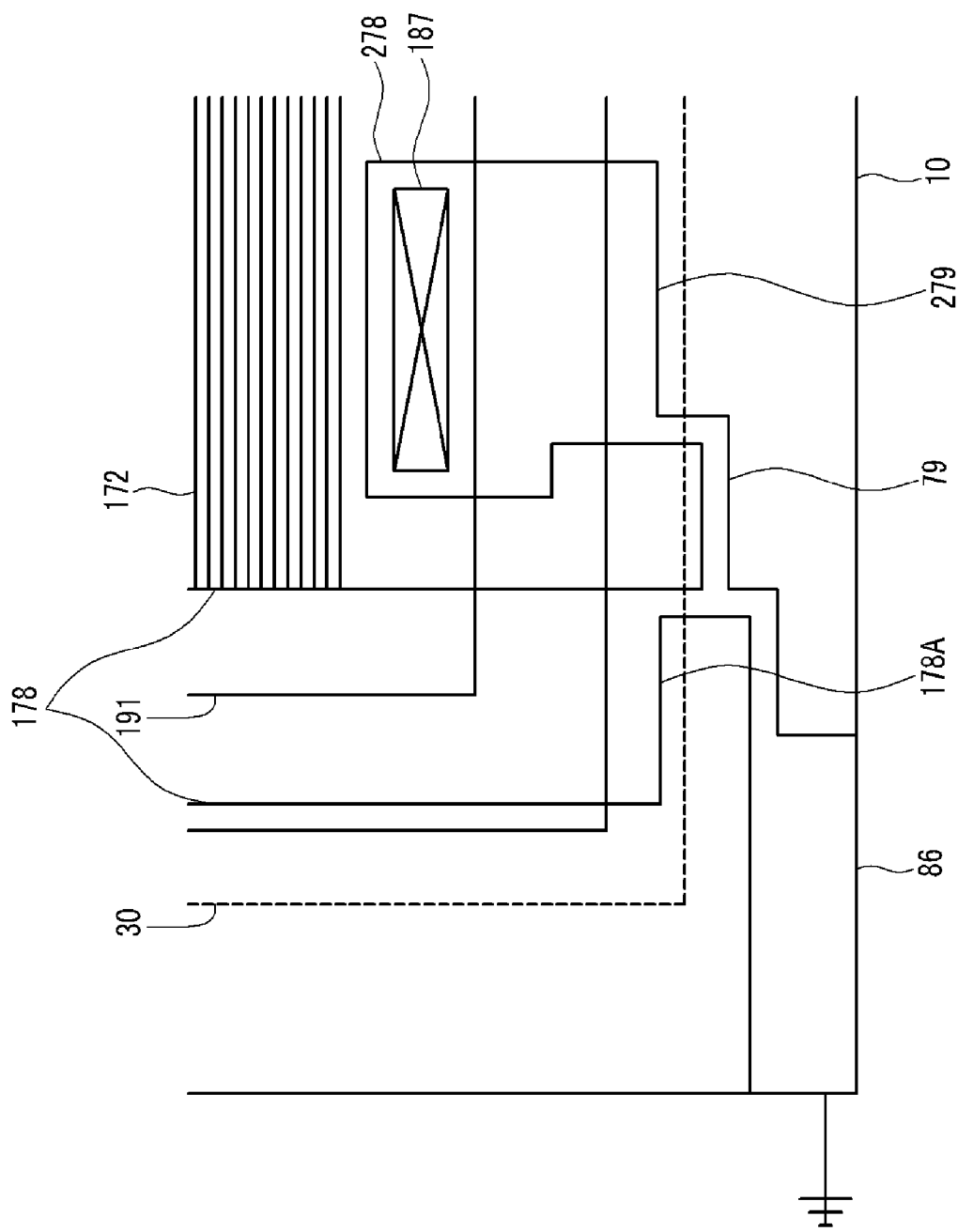
FIG. 5 is a view showing a portion of a layout of a display device according to another exemplary embodiment of the present invention.

FIG. 5 is a view showing a portion of a layout of a display device according to another exemplary embodiment of the present invention, in which the display device is formed on a base substrate.

Similar to the previous embodiments, the display device according to the present embodiment includes gate lines (not shown), data lines (not shown), driving voltage lines 172, and a thin film transistor (not shown) connected to the lines, formed on the base substrate 10.

A pixel electrode 191 is formed on the gate lines, the data lines, the driving voltage lines 172, and the thin film transistor.

A light emitting member (not shown) is formed between the pixel electrode 191 and a common electrode (not shown).

A common electrode pad 279 is formed along one periphery of the pixel electrode 191.

A portion of the common electrode pad 279 extends to serve as a contact 278 for connecting with the common electrode 270.

A driving voltage supply line 178 is commonly connected to the driving voltage lines 172, and the driving voltage supply line 178 extends to a portion neighboring the common electrode pad 279 to form the driving voltage line pad 178A.

In other words, the common electrode pad 279 and the driving voltage line pad 178A are arranged along the same periphery of the pixel electrode 191.

Unlike the display device of FIG. 4, according to the present exemplary embodiment, the common electrode pad 279 and the driving voltage line pad 178A are electrically connected to each other through the connector 79.

Since the common electrode pad 279 is formed adjacent to the driving voltage line pad 178A, it is possible to provide a shorter connector than that shown in FIG. 3A.

Additionally, similar to the embodiment of FIG. 4, the display device according to the present embodiment includes a discharge member 86 formed on the base substrate 10.

However, unlike the embodiment shown in FIG. 4, the driving voltage line pad 178A is electrically connected to both the common electrode pad 279 and the discharge member 86.

With such an arrangement, it is possible to discharge the charges generated in the common electrode 270 to an outer space through the discharge member 86 while spreading the charges toward the driving voltage lines 172. Accordingly, it may be possible to more effectively prevent failure caused by the charges generated in the common electrode 270.

Hereinafter, a display device according to another exemplary embodiment of the present invention will be described below in detail with reference to FIG. 6, FIG. 7, and FIG. 8.

Figure 6:
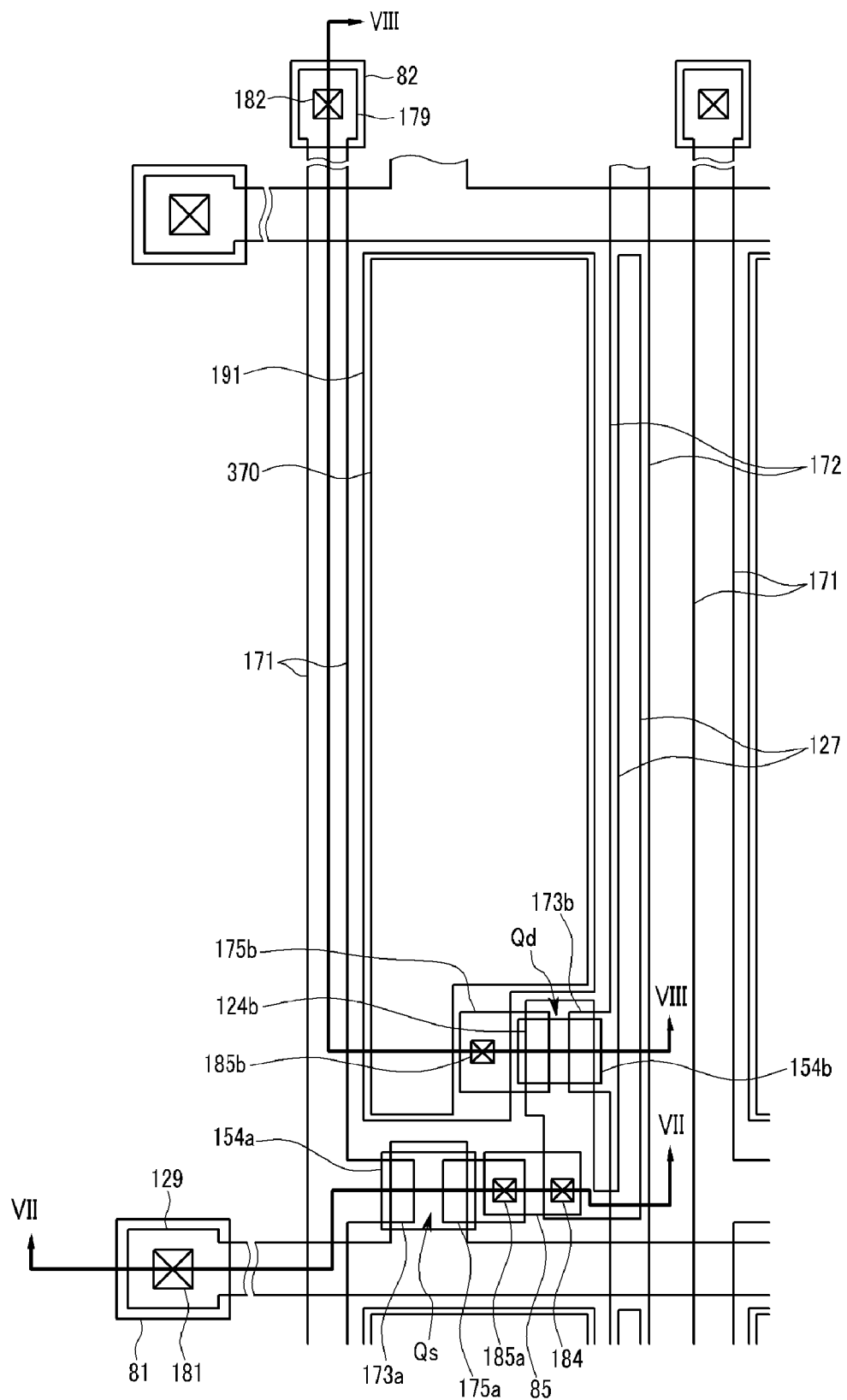
FIG. 6 is a view showing a layout of the display device according to another exemplary embodiment of the present invention.
Figure 7:
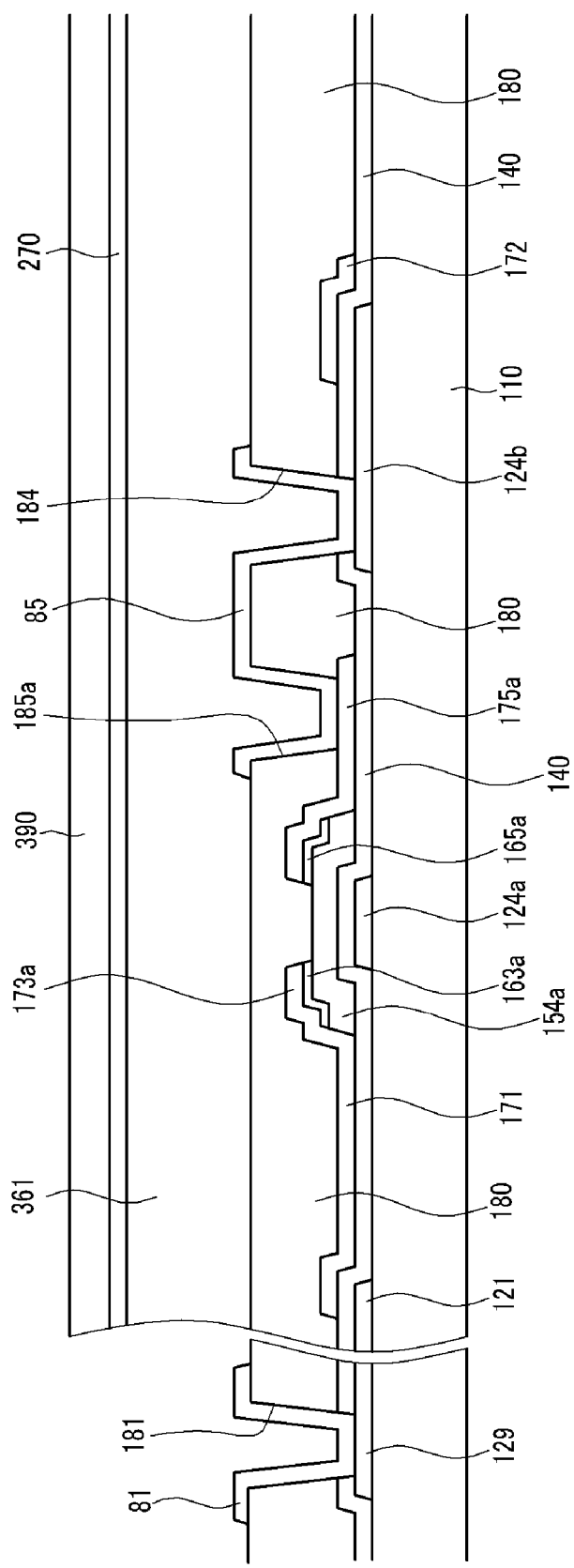
FIG. 7 and FIG. 8 are cross sectional views taken along lines VII-VII and VIII-VIII of FIG. 6, respectively.
Figure 8:
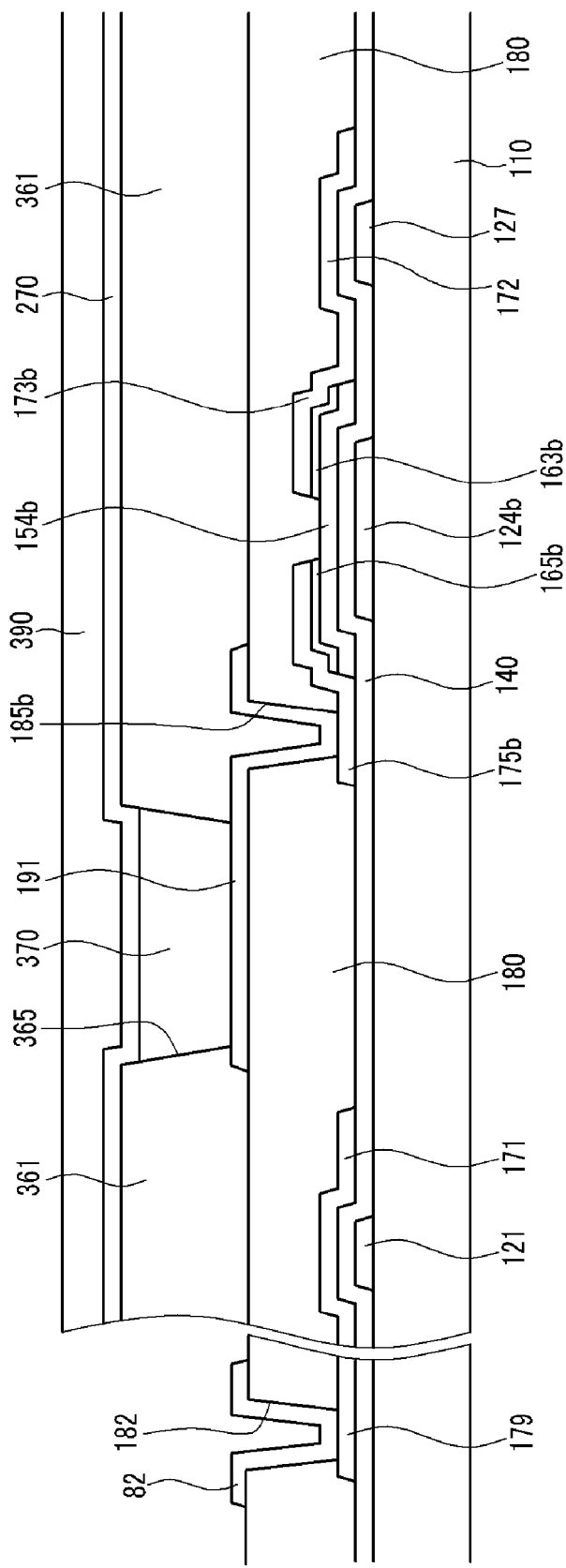

FIG. 6 is a view showing a layout of the display device according to another exemplary embodiment of the present invention, and FIG. 7 and FIG. 8 are cross-sectional views taken along lines VII-VII and VIII-VIII of FIG. 6, respectively.

A plurality of gate lines 121, which include a first control electrode 124a, and a plurality of gate conductors, which include a plurality of second control electrodes 124b, are disposed on a dielectric substrate 110, which may be made of transparent glass or plastic materials.

The gate lines 121 mainly extend in a longitudinal direction and transmit gate signals.

Each gate line 121 includes a wider end portion 129 for connection to other layers or an external driving circuit. The first control electrode 124a protrudes from the gate lines 121.

In the event that a scanning driver circuit (not shown) for generating gate signals is integrated on the dielectric substrate 110, the gate lines 121 may extend to directly connect with the scanning driver circuit.

The second control electrodes 124b are spaced apart from the gate lines 121, and as FIG. 6 shows, they include a storage electrode 127 extending downward, rightward, and then upward.

The gate conductors 121 and 124b may be made of an aluminum-based metal such as aluminum (Al) or an aluminum alloy, a silver-based metal such as silver (Ag) or a silver alloy, a copper-based metal such as copper (Cu) or a copper alloy, a molybdenum-based metal such as molybdenum (Mo) or a molybdenum alloy, chromium (Cr), tantalum (Ta) or titanium (Ti).

However, the gate conductors 121 and 124b may have a multi-layered structure including two conductive layers (not shown) that have different physical properties.

One of the two conductive layers may be made of a metal having low resistivity, for example an aluminum-based metal, a silver-based metal, or a copper-based metal, in order to reduce signal delay or voltage drop.

Preferably, the other conductive layer may be made of a material having good physical, chemical, and electrical contact characteristics to other materials, particularly to indium tin oxide (ITO) or indium zinc oxide (IZO). For example, the other conductive layer may be made of a molybdenum-based metal, chromium, titanium, or tantalum.

Examples of the multi-layered structure include a lower chromium layer and an upper aluminum (alloy) layer, and a lower aluminum (alloy) layer and an upper molybdenum (alloy) layer.

However, the gate conductors 121 and 124b may be made of various metals and conductive materials.

Surfaces of the gate conductors 121 and 124b may be slanted at angles in the range of 30° to 80° with respect to a surface of the dielectric substrate 110.

A gate insulating layer 140, which may be made of silicon nitride $SiN_x$, silicon oxide $SiO_x$, or the like, is formed on the gate conductors 121 and 124b.

A plurality of first and second island-shaped semiconductors 154a and 154b, which may be made of a hydrogenated amorphous silicon (a-Si) or polysilicon, are formed on the gate insulating film 140.

The first and second semiconductors 154a and 154b are disposed on the first and second control electrodes 124a and 124b, respectively.

A plurality of first pairs of ohmic contact members 163a and 165a and a plurality of second pairs of ohmic contact members 163b and 165b are formed above the first and second semiconductors 154a and 154b, respectively.

The ohmic contact members 163a, 163b, 165a, and 165b are island-shaped, and they may be made of silicide of an n+ hydrogenated amorphous silicon or the like that are doped with n-type impurities such as phosphorous (P).

A plurality of data conductors, which include a plurality of data lines 171, a plurality of driving voltage lines 172, and a plurality of first and second output electrodes 175a and 175b, are formed above the ohmic contact members 163a, 163b, 165a, and 165b and the gate insulating layer 140.

The data lines 171 mainly extend in the transverse direction to cross with the gate lines 121 and transmit data signals.

Each data line 171 includes a plurality of first input electrodes 173a, which extend toward the first control electrode 124a, and a wider end portion 179 for connection to other layers or an external driving circuit.

In the event that a data driver circuit (not shown) for generating data signals is integrated on the dielectric substrate 110, the data lines 171 may extend to directly connect with the data driver circuit.

The driving voltage lines 172 mainly extend in the transverse direction to cross with the gate lines 121 and transmit driving voltages.

Each driving voltage line 172 includes a plurality of second input electrodes 173b, which extend toward the second control electrodes 124b.

The driving voltage lines 172 overlap with the storage electrode 127 and may be connected to the storage electrode 127.

The first and second output electrodes 175a and 175b are spaced apart from each other, the data lines 171, and the driving voltage lines 172.

The first input electrode 173a and the first output electrode 175a oppose each other with the first control electrode 124a interposed therebetween, and the second input electrode 173b and the second output electrode 175b oppose each other with the second control electrode 124b interposed therebetween.

The data conductors 171, 172, 175a, and 175b may be made of a refractory metal such as molybdenum (Mo), chromium (Cr), tantalum (Ta), or titanium (Ti), or alloys thereof. The data conductors 171, 172, 175a, and 175b may have a multi-layered structure of a conductive layer (not shown) made of a refractory metal or the like and a conductive layer (not shown) made of a low resistance material.

Examples of the multi-layered structure include a double-layered structure of a lower chromium or molybdenum (or an alloy thereof) layer and an upper aluminum (or aluminum alloy) layer, and a triple-layered structure of a lower molybdenum (or molybdenum alloy) layer, an intermediate aluminum (or aluminum alloy) layer, and an upper molybdenum (or molybdenum alloy) layer.

However, instead of the aforementioned materials, the data conductors 171, 172, 175a, and 175b may be made of various metal and conductive materials.

Similar to the gate conductors 121 and 124b, side surfaces of the data conductors 171, 172, 175a, and 175b may also slant at angles in the range of 30° to 80° with respect to a surface of the dielectric substrate 110.

The ohmic contact members 163a, 163b, 165a, and 165b are interposed only between the underlying first and second semiconductors 154a and 154b and the overlying data conductors 171, 172, 175a, and 175b, and they reduce contact resistance therebetween.

The semiconductors 154a and 154b have exposed portions that are uncovered between the input electrodes 173a and 173b and the output electrodes 175a and 175b and by the data conductors 171, 172, 175a, and 175b.

A protective film (passivation layer) 180 is formed on the data conductors 171, 172, 175a, and 175b and the exposed portions of the semiconductors 154a and 154b.

The protective film 180 may be made of an inorganic insulating material such as silicon nitride or silicon oxide, an organic insulating material, and a low dielectric-constant insulating material.

Here, the organic insulating material and the low dielectric-constant insulating material may have a dielectric constant of 4.0 or less. Examples of materials formed by performing plasma enhanced chemical vapor deposition (PECVD) include a-Si:C:O and a-Si:O:F.

The protective film 180 may be made of an organic insulating material having a photosensitive property, and it may have a planar surface.

However, in order to use excellent properties of an organic film and protect the exposed portions of the semiconductors 154a and 154b, the protective film 180 may have a double-layered structure of a lower inorganic film and an upper organic film.

A plurality of contact holes 182, 185a, and 185b, which expose the end portions 179 of the data lines 171 and the first and second electrodes 175a and 175b, are formed in the protective film 180, and a plurality of contact holes 181 and 184, which expose the end portions 129 of the gate lines 121 and the second control electrodes 124b, are formed in the protective film 180 and the gate insulating film 140.

A plurality of pixel electrodes 191, a plurality of connecting members 85, and a plurality of contact assistant members 81 and 82 are formed on the protective film 180.

The pixel electrodes 191, the connecting members 85, and the contact assistant members 81 and 82 may be made of a reflective metal such as aluminum, silver, or alloys thereof.

The pixel electrodes 191 are connected to the second output electrodes 175b through the contact holes 185b, and the connecting members 85 are connected to the second control electrodes 124b and the first output electrodes 175a through the contact holes 184 and 185a.

The contact assistant members 81 and 82 are connected to the end portions 129 of the gate lines 121 and the end portions 179 of the data lines 171 through the contact holes 181 and 182, respectively.

The contact assistant members 81 and 82 may strengthen adhesion of the exposed end portions 179 and 129 of the data lines 171 and the gate lines 121 to external devices, as well as protect the end portions 179 and 129.

Partitions 361 are formed above the protective film 180.

The partitions 361 surround the pixel electrodes 191 like a bank to define an opening 365, and they may be made of an organic or inorganic insulating material.

Additionally, the partitions 361 may be made of a photosensitive material including a black pigment. In this case, the partitions 361 serve as a light-blocking member and may be formed in a simple process.

An organic light emitting member 370 is formed above the pixel electrodes 191 in the opening 365 defined by the partition 361.

The organic light emitting member 370 may be made of an organic material that emits red, green, or blue light.

The OLED display displays a desired image by using a spatial combination of the red, green, and blue light emitted by the organic light emitting member 370.

The organic light emitting member 370 may have a multilayered structure including a light emitting layer (not shown) and an auxiliary layer (not shown) for improving light emitting efficiency of the light emitting layer.

Examples of the auxiliary layer include an electron transport layer (ETL) (not shown) and a hole transport layer (HTL) (not shown) that balance electrons and holes, an electron injecting layer (EIL) (not shown), and an hole injecting layer (HIL) (not shown) that enhance electron and hole injection.

A common electrode 270 is formed on the organic light emitting member 370.

A common voltage Vss is applied to the common electrode 270, which may be made of a transparent conductive material such as indium tin oxide (ITO) or indium zinc oxide (IZO).

In the OLED display, the first control electrode 124a, the first input electrode 173a, and the first output electrode 175a together with the first semiconductor 154a constitute the switching thin film transistor (switching TFT) Qs, and the channel of the switching TFT Qs is formed in the first semiconductor 154a between the first input electrode 173a and the first output electrode 175a.

Additionally, the second control electrode 124b, the second input electrode 173b, and the second output electrode 175b together with the second semiconductor 154b constitute the driving TFT Qd, and the channel of the driving TFT Qd is formed in the second semiconductor 154b between the second input electrode 173b and the second output electrode 175b.

The pixel electrode 191, the organic light emitting member 370, and the common electrode 270 constitute the organic light emitting diode LD. In the present exemplary embodiment, the pixel electrode 191 and the common electrode 270 serve as anode and cathode, respectively. Alternatively, the pixel electrode 191 and the common electrode 270 may serve as cathode and anode, respectively.

The storage electrode 127 and the driving voltage lines 172 overlap with each other to constitute storage capacitors Cst.

The OLED display according to the present exemplary embodiment displays an image by emitting light in the upward direction with respect to the dielectric substrate 110.

In other words, the reflective pixel electrode 191 and the transparent common electrode 270 may be utilized in a top emission type of OLED display where an image is displayed in the upward direction with respect to the dielectric substrate 110.

When the semiconductors 154a and 154b are made of polysilicon, the semiconductors 154a and 154b include intrinsic regions (not shown) facing the control electrodes 124a and 124b and extrinsic regions (not shown) interposed between the intrinsic regions.

In this case, the extrinsic regions are electrically connected to the input electrodes 173a and 173b and the output electrodes 175a and 175b, and the ohmic contact members 163a, 163b, 165a, and 165b may be omitted.

Additionally, the control electrodes 124a and 124b may be disposed above the semiconductors 154a and 154b. In this case, the gate insulating layer 140 is also disposed between the semiconductors 154a and 154b and the control electrodes 124a and 124b.

Further, the data conductors 171, 172, 173b, and 175b are disposed above the gate insulating layer 140 and are electrically connected to the semiconductors 154a and 154b through a contact hole (not shown) formed through the gate insulating layer 140.

Alternatively, the data conductors 171, 172, 173b, and 175b may be disposed below the gate insulating layer 140 and be electrically connected to the semiconductors 154a and 154b.

A sealing member 390 is formed above the common electrode 270.

The sealing member 390 encapsulates the organic light emitting member 370 and the common electrode 270 to prevent penetration of moisture or oxygen from the outside.

The sealing member 390 may be made of an insulating material such as glass or plastic, or a resin in a shape of a film.

Next, a display device according to another exemplary embodiment of the present invention will be described in detail below with reference to FIG. 9, FIG. 10, FIG. 11, and FIG. 12.

Figure 9:
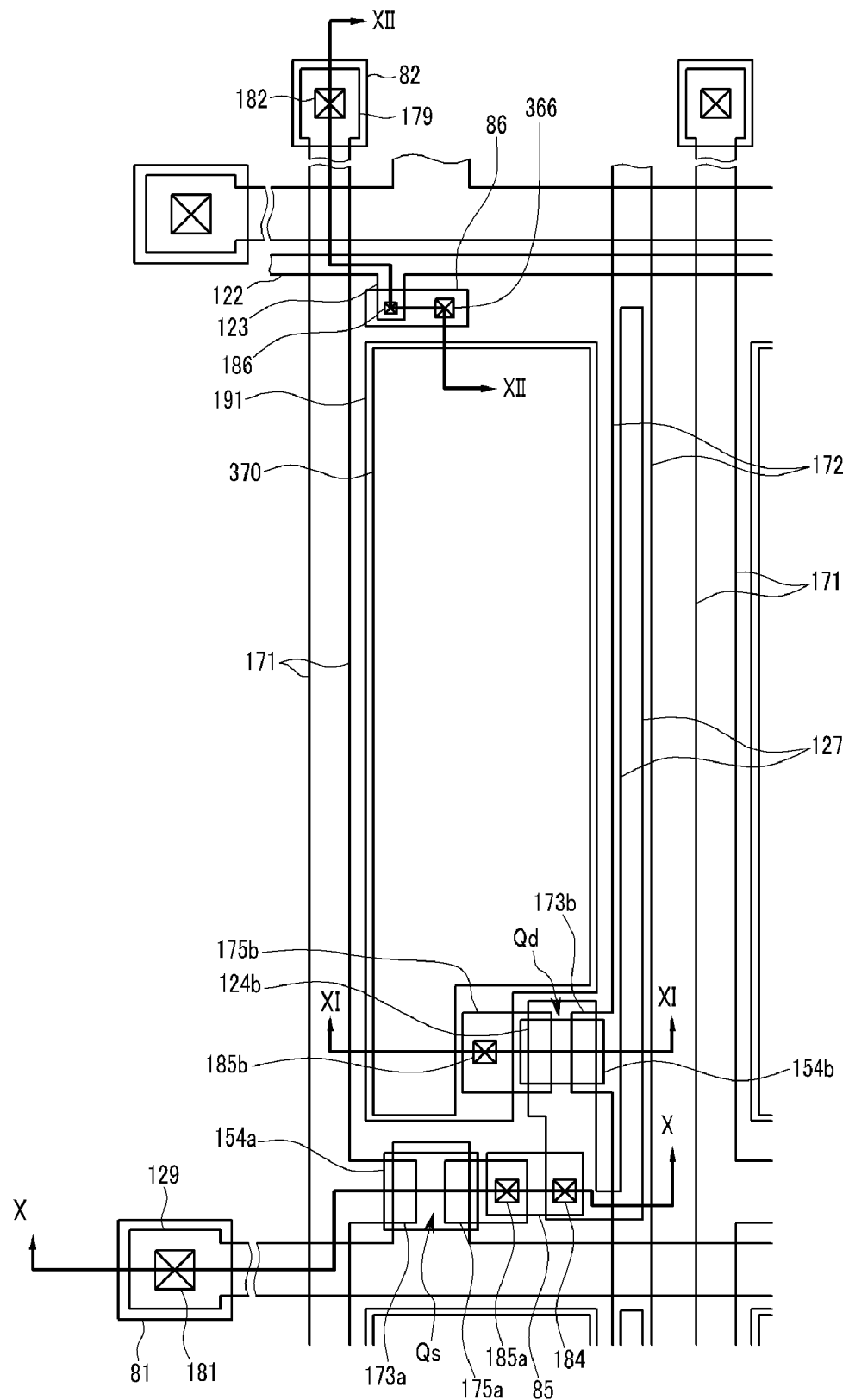
FIG. 9 is a view showing a layout of a display device according to another exemplary embodiment of the present invention.
Figure 10:
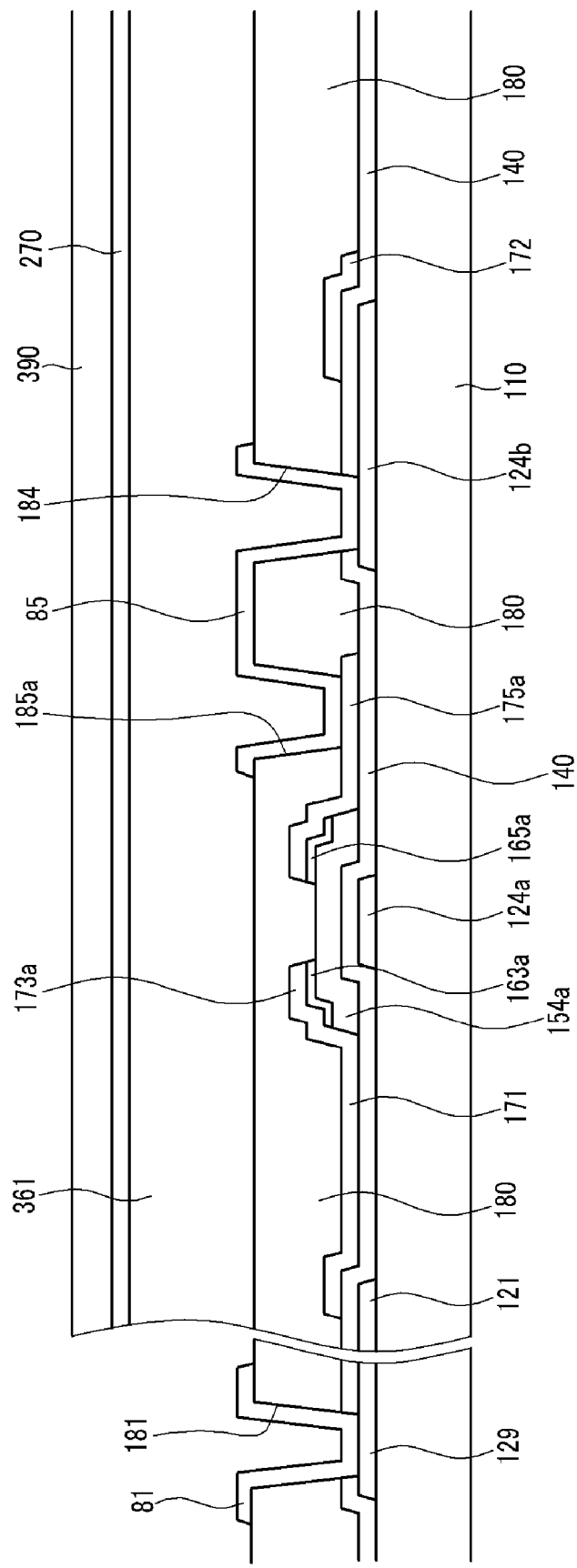
FIG. 10, FIG. 11, and FIG. 12 are cross-sectional views taken along lines X-X, XI-XI, and XII-XII of FIG. 9, respectively.
Figure 11:
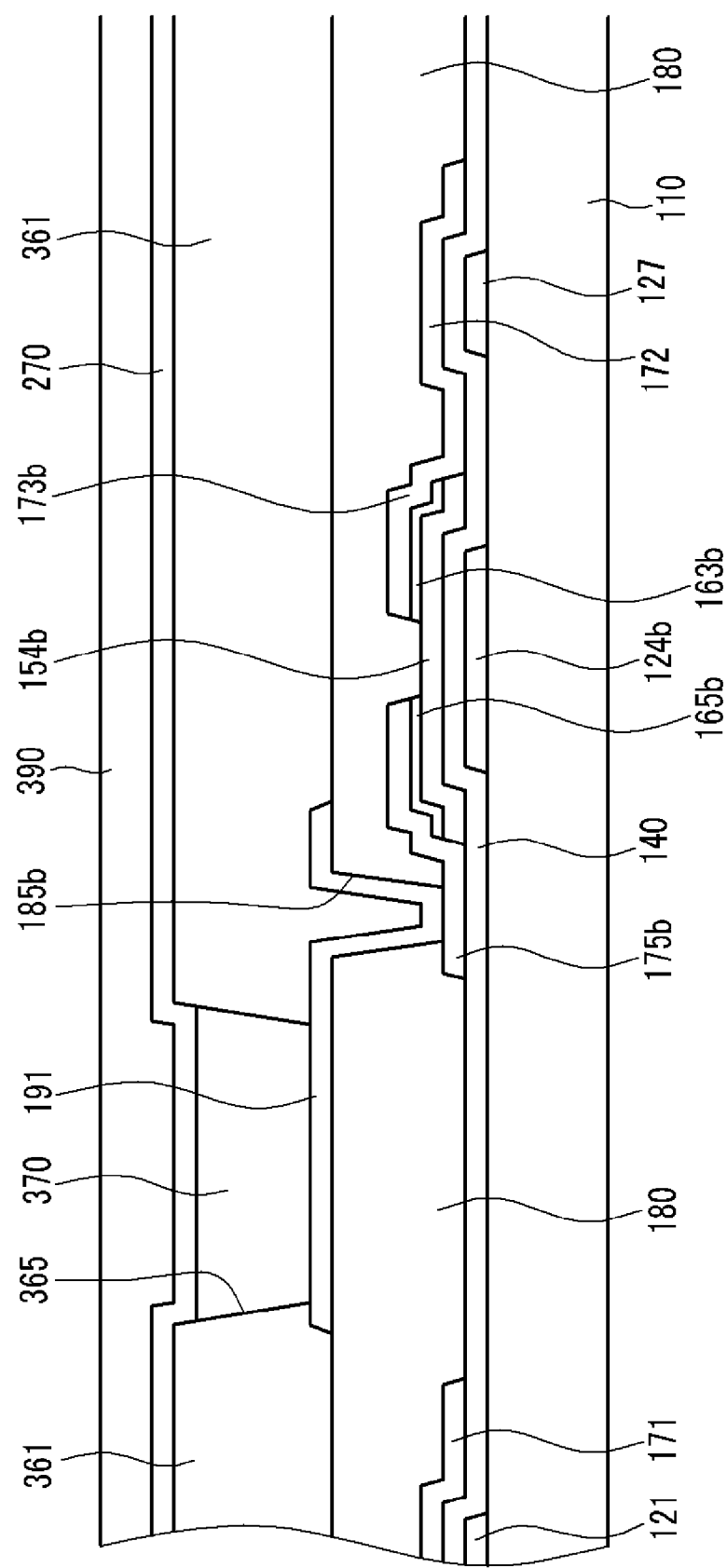
Figure 12:
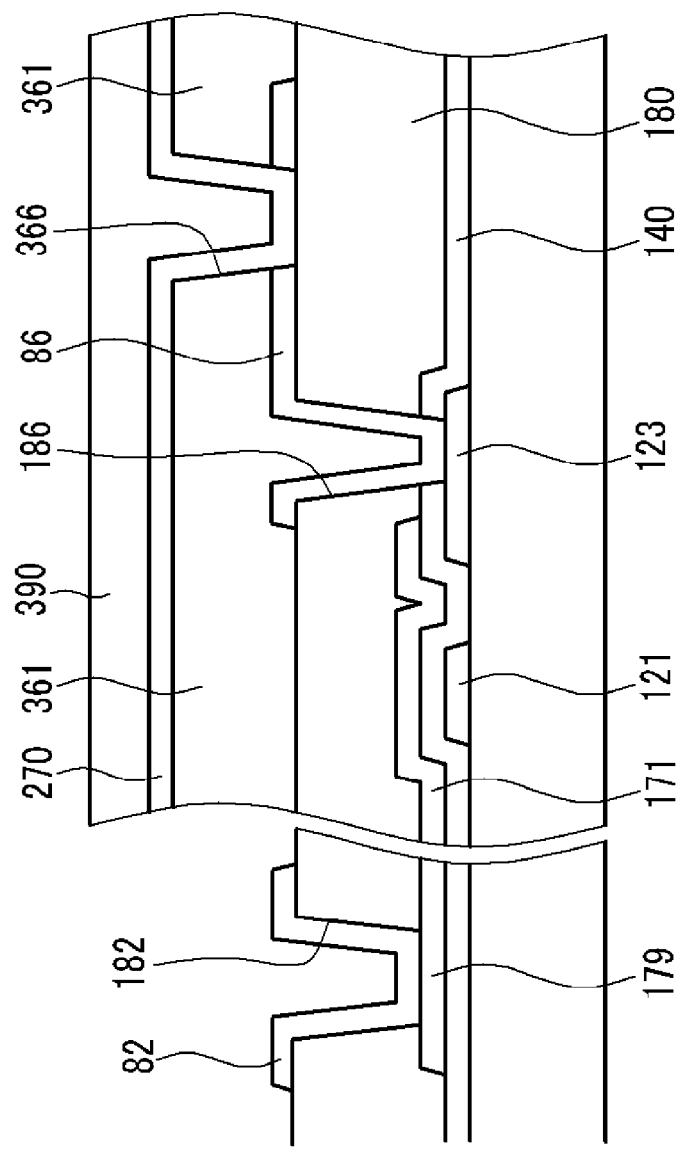

FIG. 9 is a view showing a layout of a display device according to an exemplary embodiment of the present invention, and FIG. 10, FIG. 11, and FIG. 12 are cross-sectional views taken along lines X-X, XI-XI, and XII-XII of FIG. 9, respectively.

A plurality of gate lines 121, which include a first control electrode 124a, and a plurality of gate conductors, which include a plurality of second control electrodes 124b, are disposed on a dielectric substrate 110.

Each gate line 121 includes a wider end portion 129.

The second control electrodes 124b include a storage electrode 127 extending therefrom.

A gate insulating layer 140 is formed above the gate conductors 121 and 124b.

A plurality of first and second island-shaped semiconductors 154a and 154b are formed on the gate insulating film 140, and a plurality of first pairs of ohmic contact members 163a and 165a and a plurality of second pairs of ohmic contact members 163b and 165b are formed above the first and second semiconductors 154a and 154b, respectively.

A plurality of data conductors, which include a plurality of data lines 171, a plurality of driving voltage lines 172, and a plurality of first and second output electrodes 175a and 175b, are formed above the ohmic contact members 163a, 163b, 165a, and 165b and the gate insulating layer 140.

Each data line 171 includes a plurality of first input electrodes 173a, which extend toward the first control electrode 124a, and a wider end portion 179 for connection to other layers or an external driving circuit.

Each driving voltage line 172 includes a plurality of second input electrodes 173b, which extend toward the second control electrodes 124b.

The first and second output electrodes 175a and 175b are spaced apart from each other, the data lines 171, and the driving voltage lines 172.

A protective film 180 is formed on the data conductors 171, 172, 175a, and 175b and the exposed portions of the semiconductors 154a and 154b. A plurality of contact holes 182, 185a, and 185b, which expose the end portions 179 of the data lines 171 and the first and second output electrodes 175a and 175b, are formed in the protective film 180. Additionally, a plurality of contact holes 181 and 184, which expose the end portions 129 of the gate lines 121 and the second control electrodes 124b, are formed in the protective film 180 and the gate insulating film 140.

A plurality of pixel electrodes 191, a plurality of first and second connecting members 85 and 86, and a plurality of contact assistant members 81 and 82 are formed on the protective film 180.

The pixel electrodes 191 are connected to the second output electrodes 175b through the contact holes 185b, and the connecting members 85 are connected to the second control electrodes 124b and the first output electrodes 175a through the contact holes 184 and 185a.

Partitions 361 are formed above the protective film 180.

An organic light emitting member 370 is formed above the pixel electrodes 191 in the opening 365 defined by the partition 361.

A common electrode 270 is formed on the organic light emitting member 370.

A sealing member 390 is formed above the common electrode 270.

However, unlike the display device in FIGS. 6 to 8, according to the present exemplary embodiment, the pixel electrode 191 is made of a transparent conductive material such as indium tin oxide (ITO) or indium zinc oxide (IZO), and the common electrode 270 is made of a reflective metal such as calcium (Ca), barium (Ba), magnesium (Mg), aluminum (Al), or silver (Ag).

Accordingly, the display device according to the present exemplary embodiment displays an image by emitting light in the downward direction with respect to the dielectric substrate 110.

In other words, the transparent pixel electrode 191 and the reflective common electrode 270 are utilized in a bottom emission type of OLED display where the image is displayed in the downward direction with respect to the dielectric substrate 110.

In addition, unlike the display device in FIGS. 6 to 8, the display device according to the present exemplary embodiment further includes an assistant electrode line 122 that extends in parallel with the gate lines 121.

The assistant electrode line 122 includes a protrusion 123 protruding therefrom in the transverse direction, and serves to transmit a common voltage.

The assistant electrode line 122 may be made of the same material and in the same layer as that of the gate lines 121 or the data lines 171, and it may extend in parallel with the gate lines 121.

Additionally, a contact hole 186 in the protective film 180 exposes the protrusion 123 of the assistant electrode line 122.

The second connecting member 86 is connected to the protrusion 123 of the assistant electrode line 122 through the contact hole 186.

The common electrode 270 is connected to the protrusion 123 of the assistant electrode line 122 through a contact hole 366 and the second connecting member 86.

Since the common electrode 270 is connected to the protrusion 123 of the assistant electrode line 122, it may be possible to stably supply the common voltage to the common electrode 270 even when the common electrode 270 is made of a transparent or semi-transparent conductive material that has a relatively high resistance.

Consequently, it may be possible to supply a substantially uniform common voltage to the entire region of the common electrode 270 without causing a voltage drop.

According to exemplary embodiments of the present invention, it may be possible to discharge charges accumulated on the common electrode during the display device manufacturing process, thereby enhancing reliability of the display device.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A display device, comprising:
    a substrate;
    a first voltage line disposed on the substrate;
    a first electrode pad to transmit a driving voltage to the first voltage line;
    a first transistor connected to the first voltage line;
    a first electrode connected to the first transistor;
    a second electrode opposing the first electrode;
    a light emitting member disposed between the first electrode and the second electrode; and
    a second electrode pad disposed on the substrate, the second electrode pad to transmit a second voltage to the second electrode,
    wherein the second electrode pad and the first electrode pad are exposed at a side of the substrate, and
    wherein end portions of the exposed second electrode pad and the exposed first electrode pad coincide with edges of the substrate.

2. The display device of claim 1,
    wherein at least one side of each of the second electrode pad and the first electrode pad includes a first portion that is exposed at the side of the substrate and a second portion that is not exposed at the side of the substrate; and
    wherein a distance between the second portion of the second electrode pad and the side of the substrate or a distance between the second portion of the first electrode pad and the side of the substrate is 25 µm or less.

3. A method of manufacturing a display device, comprising:
    forming a plurality of first signal lines, a driving first voltage line including a first electrode pad, a plurality of second signal lines, and a second electrode pad on a substrate;
    forming a first connecting member between the first electrode pad and the second electrode pad;
    forming a protective film and a first electrode on the first signal lines, the first voltage line, and the second signal lines;
    forming a light emitting layer on the first electrode;
    forming a second electrode on the light emitting layer;
    forming a sealing member on the second electrode; and
    cutting the substrate such that the first connecting member is exposed at a side of the substrate,
    wherein end portions of the exposed first connecting member coincide with edges of the substrate.

4. The method of claim 3, wherein cutting the substrate includes cutting the first connecting member.

5. The method of claim 3, wherein the first electrode pad comprises the same material as the second signal lines.

6. The method of claim 3, wherein the second electrode pad comprises the same material as the first signal lines.

7. The method of claim 6, wherein the second electrode is transparent.

8. The method of claim 7, wherein the first connecting member comprises the same material as the second electrode.

9. The method of claim 6, wherein the first electrode is transparent.

10. The method of claim 9, wherein the first connecting member comprises the same material as the first electrode.

11. The method of claim 3, wherein the second electrode pad comprises the same material as the second signal lines.

12. The method of claim 11, wherein the first connecting member comprises the same material as the second signal lines.

13. The method of claim 3, further comprising:
forming a first signal line shorting bar that connects the plurality of first signal lines to each other; and
forming a second signal line shorting bar that connects the plurality of second signal lines to each other.

14. The method of claim 13, further comprising:
forming a second connecting member that connects the first electrode pad to the first signal line shorting bar or the second signal line shorting bar.

15. The method of claim 13, further comprising:
forming a second connecting member that connects the second electrode pad to the first signal line shorting bar or the second signal line shorting bar.

16. The method of claim 14, wherein cutting the substrate comprises cutting the second connecting member.

17. The method of claim 15, wherein cutting the substrate comprises cutting the second connecting member.

18. The method of claim 3, further comprising:
forming a discharge member on the substrate and connected to the first connecting member.

19. The method of claim 14, further comprising:
forming a discharge member on the substrate and connected to at least one of the first connecting member and the second connecting member.

20. The method of claim 15, further comprising:
forming a discharge member on the substrate and connected to at least one of the first connecting member and the second connecting member.

21. The method of claim 18, wherein the discharge member is connected to a ground potential.

22. The method of claim 19, wherein cutting the substrate comprises removing the discharge member.

23. The method of claim 3, wherein cutting the substrate comprises removing the discharge member.

* * * * *